United States Patent
Zhang et al.

(10) Patent No.: US 12,550,773 B2
(45) Date of Patent: Feb. 10, 2026

(54) CHIP EMBEDDED COMPOSITE FOR ELECTRON BEAM LITHOGRAPHY, PREPARATION METHOD AND APPLICATION THEREOF

(71) Applicant: THE CHINESE UNIVERSITY OF HONGKONG, SHENZHEN, Guangdong (CN)

(72) Inventors: Zhaoyu Zhang, Guangdong (CN); Yaoran Huang, Guangdong (CN); Gexing Liu, Guangdong (CN); Haochuan Li, Guangdong (CN)

(73) Assignee: THE CHINESE UNIVERSITY OF HONGKONG, SHENZHEN, Guangdong (CN)

( * ) Notice: Subject to any disclaimer, the term of this patent is extended or adjusted under 35 U.S.C. 154(b) by 233 days.

(21) Appl. No.: 18/002,573

(22) PCT Filed: Jan. 18, 2022

(86) PCT No.: PCT/CN2022/072513
§ 371 (c)(1),
(2) Date: Dec. 20, 2022

(87) PCT Pub. No.: WO2022/152312
PCT Pub. Date: Jul. 21, 2022

(65) Prior Publication Data
US 2023/0343605 A1    Oct. 26, 2023

(30) Foreign Application Priority Data

Jan. 18, 2021 (CN) .................. 202110064658.9

(51) Int. Cl.
*H01L 21/56* (2006.01)
*H01L 23/31* (2006.01)
*H01L 23/29* (2006.01)

(52) U.S. Cl.
CPC ........ *H01L 21/561* (2013.01); *H01L 23/3185* (2013.01); *H01L 23/293* (2013.01)

(58) Field of Classification Search
None
See application file for complete search history.

(56) References Cited

U.S. PATENT DOCUMENTS

2002/0089053 A1    7/2002    Liu et al.
2003/0112604 A1    6/2003    Hsu
(Continued)

FOREIGN PATENT DOCUMENTS

CN    101567322 A    10/2009
CN    102768970 A    11/2012
(Continued)

*Primary Examiner* — Jay C Chang
(74) *Attorney, Agent, or Firm* — Brooks Kushman P.C.

(57) ABSTRACT

The present application relates to the technical filed of semiconductor chip nanofabrication, provides a method for preparing a chip embedded composite for electron beam lithography. The preparation method includes: providing a composite structure, the composite structure including a first substrate, a conductive layer disposed on a surface of the first substrate and a chip array disposed on a surface of the conductive layer away from the first substrate; arranging a protective layer on an outer surface of the chip array, where the protective layer covers the chip array; encapsulating and curing the composite structure and the protective layer by a polymer solution; removing the protective layer to obtain the chip embedded composite.

15 Claims, 3 Drawing Sheets

(56) References Cited

U.S. PATENT DOCUMENTS

| | | | |
|---|---|---|---|
| 2005/0095839 A1 | 5/2005 | Chang et al. | |
| 2007/0278631 A1 | 12/2007 | Sharifi et al. | |
| 2008/0315375 A1 | 12/2008 | Eichelberger et al. | |
| 2016/0035667 A1* | 2/2016 | Huang | H01L 24/20 |
| | | | 257/668 |
| 2016/0071779 A1* | 3/2016 | Chen | H01L 23/5389 |
| | | | 257/787 |
| 2016/0285391 A1* | 9/2016 | Asanuma | H02N 1/08 |
| 2019/0006196 A1 | 1/2019 | Qu | |

FOREIGN PATENT DOCUMENTS

| | | |
|---|---|---|
| CN | 208622769 U | 3/2019 |
| JP | H09283404 A | 10/1997 |
| JP | 2003243594 A | 8/2003 |

\* cited by examiner

CHIP EMBEDDED COMPOSITE FOR ELECTRON BEAM LITHOGRAPHY, PREPARATION METHOD AND APPLICATION THEREOF

CROSS-REFERENCE TO RELATED APPLICATION

This application is a U.S. national phase of International Patent Application No. PCT/CN2022/072513 with an international filing date of Jan. 18, 2022, designating the U.S. now pending, and further claims priority to Chinese patent application No. 202110064658.9 filed with the Chinese Patent Office on Jan. 18, 2021, the entire contents of which are incorporated herein by reference.

TECHNICAL FIELD

The present application belongs to the technical field of semiconductor chip fabrication, in particular, relates to a chip embedded composite for electron beam lithography and a preparation method and application thereof.

BACKGROUND

Optical pattern exposure (lithography) technology is widely used in the 21st century because of its low cost, high yield, high resolution, and easy operation. However, to meet the needs of sub-100 nm integrated circuit processes, electron beam lithography (EBL) is widely used for next-generation VLSI in the semiconductor industry. Its advantages are excellent depth of focus, the ability to correct large-scale height variations of the wafer, allowing multiple patterns to be lithographed together on a single wafer, high automation, and high-precision control, etc. However, the EBL equipment has a low yield, which is about two wafers per hour when the resolution is less than 100 nm. The low-efficiency yield is only suitable for the production of mask and the circuit design with small demand. Therefore, for the purpose of scientific research, it is essential to make full use of the entire chip especially the corner (the area covered by conductive tape and metal clips for fixing) by EBL to make the pattern of optoelectronic semiconductor chips, engraving various design patterns on the chip to improve the utilization rate. However, EBL has strict requirements on whether the surface of the e-beam resist must be a flat surface.

At present, for the progress of scientific research projects, the economical utilization of funds and time, it is difficult to place the whole epitaxial wafer on the EBL equipment for exposure. At present, most of the methods is to slice one of a tiny chiplet with small surface area for EBL. The difficult problem lies in two points: (1) Due to the small surface area (2 mm×4 mm) of the chiplet, it is difficult to vacuumize and fix it on the spin-coater. (2) The chiplet needs to be fixed on the mechanical platform of the EBL equipment to prevent the chiplet from dislocating when the electron beam is bombarded, which affects the entire designed pattern. If the corners are covered with heat-resistant tape, a part of the lithography area of the chiplet will be inevitably wasted.

Therefore, in order to carry out spin-coating and EBL without wasting available wafers, the surface area of chiplet needs to be "expanded". However, the precision of the EBL process is very high, if the chiplet is only fixed on the flat bottom surface, the height difference between the chiplet surface and the bottom surface will cause uneven spin-coating result and serious errors in exposure accuracy.

Technical Problem

The present application provides a chip embedded composite for electron beam lithography and a preparation method and application thereof, aiming at solving the problems that chiplets cannot be directly spin-coated, and photolithography area is wasted in the fixing of chiplets in EBL in the existing technology.

TECHNICAL PROPOSAL

The technical proposals adopted in this application is as follows:

In a first aspect, the present application provides a method for preparing chip embedded composite for EBL, including the following steps:
 arranging a composite structure, the composite structure including a first substrate, a conductive layer being disposed on a surface of the first substrate, and a chip array being disposed on a surface of the conductive layer away from the first substrate;
 arranging a protective layer on an outer surface of the chip array, and the protective layer covering the chip array;
 encapsulating and curing the composite structure and the protective layer by using a polymer solution;
 removing the protective layer to obtain a chip embedded composite.

In a second aspect, the present application provides a chip embedded composite for EBL, the chip embedded composite includes a first substrate, a conductive layer disposed on the surface of the first substrate, and a chip-embedded layer disposed on a surface of the conductive layer away from the first substrate, the chip-embedded layer includes a chip array in contact with the conductive layer and an embedding layer distributed between the chip array.

In a third aspect, the present application provides an application of the chip-embedded composite for EBL in designing integrated circuits by lithography.

The first aspect of the present application provides a method for preparing a chip-embedded composite for EBL. The preparation method utilizes a composite structure including chips as a raw material and arranges a protective layer on the outer surface of the chip array of the composite structure, to protect the chip array and provide a flat surface. Further, a polymer solution is provided for encapsulation and cure, and polymer fillers are formed in the intervals of the chip array; and then the protective layer is removed to obtain a chip embedded composite, so that the surface of the chip can be directly spin-coated evenly, and EBL can be carried out, which makes full use of the lithography area of the chip, so that chiplets with small size will not be wasted in lithography and all regions can be fully utilized. The method improves the utilization rate of the chip, and at the same time, the composite structure includes a conductive layer to realize electrical conduction, which is beneficial for EBL process and future application; the preparation method benefits from low material cost, simple production process, convenient operation, and short operation time. The obtained chip embedded composite has high yield, stable performance, and high operation fault tolerance, is therefore favorable for wide use.

The second aspect of the present application provides a chip embedded composite for EBL, in which the chip array and the embedding layer between the chip array are in the same horizontal plane, so that the embedded composite can be directly spin-coated evenly, and EBL can be carried out. At the same time, the utilization of the photolithography area of the chip can be maximized without waste, and the conductive layer can achieve electrical conduction, maintaining the overall conductivity of the composite, so that the emitted electrons can pass through the chip surface without being accumulated inside the chip when the electron beam lithography equipment operates at high voltages.

The third aspect of the present application provides an application of the chip embedded composite for EBL in the design of integrated circuits by electron beam lithography. Based on the fact that the chip embedded composite has a flat surface, an even spin-coating can be applied thereon, and the composite can be widely used for EBL for the designing of integrated circuit, which improves the utilization rate of the chip.

BRIEF DESCRIPTION OF DRAWINGS

In order to more clearly illustrate the technical proposals in the embodiments of the present application, the accompanying drawings in the descriptions of the embodiments or the prior art will be briefly explained below. Apparently, the drawings in the following description are only some embodiments of the present application, and those skilled in the art can obtain other drawings according to these drawings without creative efforts.

DETAILED DESCRIPTION OF THE EMBODIMENTS

Figure 1:
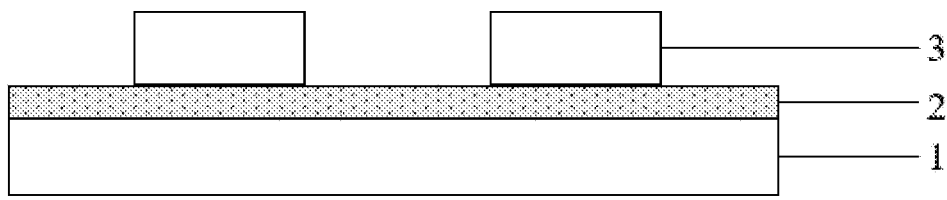
FIG. 1 is a schematic diagram of a composite structure provided by an embodiment of the present application.

In order to make the purpose, technical proposals, and advantages of the present application more clearly understood, the present application will be described in further detail hereinbelow with reference to the accompanying drawings and embodiments. It should be understood that the specific embodiments described herein are merely used to explain the present application, but not to limit the present application.

In the present application, the term "and/or", which describes the relationship between related objects, means that there can be three relationships, for example, A and/or B, which can represent circumstances that A exists alone, A and B exist at the same time, and B exists alone, where A and B can be singular or plural. The character "/" generally indicates that the associated objects are an "or" relationship.

In this application, "at least one" means one or more, and "a plurality of" means two or more. "At least one item below" or similar expressions refer to any combination of these items, including any combination of single item or plural items. For example, "at least one of a, b, or c" can mean: a, b, c, a-b (i.e., a and b), a-c, b-c, or a-b-c, where a, b, and c can be singular or plural respectively.

It should be understood that, in various embodiments of the present application, the order of the sequential numbers of the above-mentioned processes does not imply the sequence of execution, some or all of the steps may be executed in parallel or sequentially, and the execution sequence of each process should be based on its functions and determined by the internal logic, and should not constitute any limitation on the implementation process of the embodiments of the present application.

The terms used in the embodiments of the present application are merely for the purpose of describing detailed embodiments, and are not intended to limit the present application. As used in the embodiments of this application and the appended claims, the singular forms "a," "said", and "the" are intended to include their plural forms as well, unless the context clearly dictates otherwise.

The weight of the relevant compositions mentioned in the examples of this application can not only refer to the specific content of each composition, but also represent the proportional relationship between the weights of the compositions. It is within the scope disclosed in the embodiments of the present application that the content of the compositions is proportionally scaled up or down. Specifically, the mass described in the description of the embodiments of the present application may be a mass unit known in the chemical field, such as μg, mg, g, and kg.

The terms "first" and "second" are merely used for descriptive purposes to distinguish objects such as substances from each other, and cannot be understood as indicating or implying relative importance or implying the number of indicated technical features. For example, without departing from the scope of the embodiments of the present application, "the first" may also be referred to as "the second", and similarly, "the second" may also be referred to as "the first". Thus, a feature defined as "first" or "second" may expressly or implicitly include one or more of the features.

The first aspect of the embodiments of the present application provides a method for preparing chip embedded composite for EBL, including the following steps:

In step S01: a composite structure is arranged, the composite structure includes a first substrate, a conductive layer disposed on the surface of the first substrate, and a chip array disposed on a surface of the conductive layer away from the first substrate;

In step S02: a protective layer is arranged on the outer surface of the chip array, and the protective layer covers the chip array;

In step S03: a polymer solution is used to encapsulate and cure the composite structure and protective layer; and In step S04: the protective layer is removed to obtain a chip embedded composite.

The first aspect of the present application provides a method for preparing a chip-embedded composite for EBL. The preparation method utilizes a composite structure including chips as a raw material. The composite structure is placed in a container such that the chips in the composite material are in contact with the soft bottom surface of the container. The polymer solution is added for curing, and an embedding layer is formed in the intervals of the chip array to obtain the chip embedded composite. The chip embedded composite includes the embedding layer between and in the same horizontal plane of the chip array, so that the surface of the chip can be directly spin-coated evenly, and EBL can be carried out, which makes full use of the lithography area of the chip, so that chiplets with small size will not be wasted in lithography. The method improves the utilization rate of the chip, and at the same time, the composite structure includes a conductive layer to realize ground conduction, which is beneficial to the EBL process and future application; the preparation method benefits from low material cost, simple production process, convenient operation, and short operation time. The obtained chip embedded composite has high yield, stable performance, and high operation fault tolerance, is therefore favorable for wide use.

In step S01, a composite structure is provided, as shown in FIG. 1, wherein the composite structure includes the first substrate 1, the conductive layer 2 disposed on the surface of the first substrate, and the chip array 3 disposed on the surface of the conductive layer 2 away from the first substrate.

Optionally, the first substrate may be selected from materials with a smooth surface, high electrical conductivity, and high temperature resistance, and conventional materials that meet the above conditions may be used. In some embodiments, the first substrate is selected from a silicon wafer with dopants, which is favorable for right-angle cutting processing and convenient for use.

Optionally, the thickness of the first substrate is not limited, and a substrate with a conventional thickness may be selected for use as needed.

Optionally, the material of the conductive layer may be selected from conductive adhesive materials with high conductivity, high temperature resistance and curable properties. In some embodiments, the material of the conductive layer is ECA-1003 conductive adhesive, and ECA-1003 conductive adhesive is selected as the material of the conductive layer because it can be quickly cured and at the same time ensure good conductivity, thereby aiding the chip embedded composite in the EBL.

Optionally, the size of the chip is (2-3) mm×(4-5) mm. Since chips with larger specifications can be used directly, this application mainly focuses on a method for recycling small chips. The method can be applied for small chips to maximize the utilization of the photolithography area on the chips. The curing process will not cause the waste of lithography area, and can make full use of chiplets, improve the utilization rate of chips, save valuable consumables, and allow a low material cost and simple fabrication process. In some embodiments, the size of the chip is 2 mm×4 mm.

Optionally, the chiplets need to have a small surface area. During the preparation process, two chiplets with approximately same size are provided in order to obtain a flat surface and realize the effect of uniform spin-coating.

In some embodiments, the preparation of the chip embedded composite requires experimental operations, including all steps such as the preparation of the provided composite structure, to be carried out in a clean room with a cleanliness level of ≤1000.

In some embodiments, when the composite structure is "chip-conductive adhesive-substrate", the preparation method includes the following steps:
 a first substrate and chips are provided, and impurity are removed from the first substrate and the chips; and
 a conductive layer is coated on the surface of the first substrate, a plurality of chips are arranged on the surface of the conductive layer away from the first substrate, and a heat curing process is performed to obtain a composite structure.

The composite structure includes the first substrate, the conductive layer disposed on the surface of the first substrate, and a chip array disposed on the surface of the conductive layer away from the first substrate.

Figure 2:
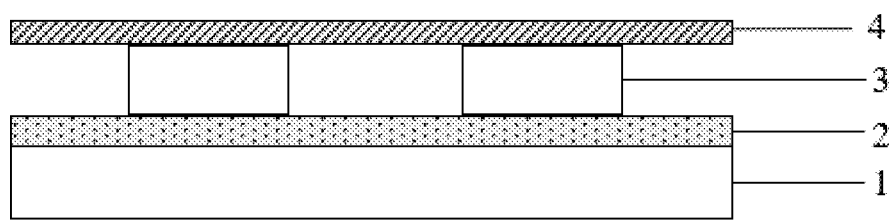
FIG. 2 is a schematic diagram of the composite structure laminated with the protective layer provided in the embodiment of the present application.

In step S02, as shown in FIG. 2, a protective layer 4 is arranged on the outer surface of the chip array 3, and the protective layer 4 covers the chip array; on the one hand, the protective layer is arranged so as to protect the surface of the chips, and on the other hand, it is to provide a flat surface, which aids subsequent preparations of the material.

In some embodiments, the protective layer is selected from a soft film layer with a flat surface or a hard-substrate composite.

Further, a soft film layer with a flat surface is beneficial to a better contact with the chips, and at the same time, it is easier to detach after the chip embedded structure is formed, without affecting the use of the chips.

In some embodiments, a soft film layer is arranged on the outer surface of the chip array, and the preparation method includes the following steps:
 a container is provided, and the impurities are removed;
 a solution of the soft film layer is prepared and stirred uniformly, the solution is introduced into the container and vacuumized until the liquid surface has no bubbles, and then heat cured to obtain the soft film layer;
 the soft film layer is attached to the outer surface of the chip array to obtain a protective layer on the outer surface of the chip array.

Optionally, the container is a container with a flat surface, and the material is not limited. In some embodiments, the container may be selected from conventional glass petri dishes.

Further, the step of removing impurities includes: soaking in acetone for about 2 minutes, pouring into the waste tank, then washing the residual acetone on the surface of the container with isopropanol, and finally drying the surface of the container with a nitrogen gun to obtain a clean container surface.

Optionally, the thickness of the soft film layer is 2-4 microns, and the thickness of the soft film layer is controlled to be suitable to be cut off from the finished product.

Optionally, the material of the soft film layer is selected from the materials consistent with the material of the polymer solution, which is beneficial to the curing treatment. In some embodiments, the material of the soft film layer is at least one selected from polydimethylsiloxane, benzocyclobutene, epoxy resin, dimethylsiloxane, cyclomethylsiloxane, aminosiloxane, polymethylphenylsiloxane, and polyether polysiloxane copolymer.

Further, a flat hard-substrate composite is provided, and a hard-substrate material can ensure the formation of a flat surface. The hard-substrate composite includes a second substrate and a connection layer, and the connection layer and the second substrate are sequentially stacked along the extending direction from the conductive layer to the chip array, and the connection layer covers the chip array.

Optionally, the material of the connection layer is selected from materials with high adhesion and are easy to cut. In some embodiments, the material of the connection layer is selected from PMMA materials.

Optionally, the thickness of the connection layer is 1-1.2 microns, and the connection layer is provided mainly for bonding the second substrate and the chips, in order to ensure a flat surface of the chips, aiding in cutting and detaching.

In some embodiments, a protective layer is arranged on the outer surface of the chip array, and the protective layer is a hard-substrate composite, and the preparation method includes the following steps:
- a first substrate, a second substrate and chips are provided, and impurities are removed from the first substrate, the second substrate and the chips;
- a conductive layer is arranged on the surface of the first substrate, and a plurality of chips are arranged on the surface of the conductive layer away from the first substrate, and heat curing treatment is performed;
- after drying the surface of the second substrate, an insulating adhesive is spin-coated with a spin-coater and then dried to obtain a connection layer disposed on the surface of the second substrate; and
- the connection layer and the chip array are bonded to obtain a protective layer disposed on the outer surface of the chip array.

Optionally, in the step of removing impurities, acetone and isopropanol are used for cleaning and removing impurities, so as to ensure that the first substrate, the second substrate and the chips are clean and tidy and free of impurities.

In step S03, a polymer solution is used to encapsulate and cure the composite structure and the protective layer.

The composite structure and the protective layer are encapsulated and cured by using a polymer solution, and the polymer solution is selected from materials that can be cured below 300° C. to ensure that the embedded layer is properly formed.

In some embodiments, the material of the polymer solution is at least one selected from polydimethylsiloxane, benzocyclobutene, epoxy resin, and cyclomethicone. The contact angle of the provided polymer solution material and the chips surface to the conductive adhesive is small, so as to ensure that the obtained chip embedded composite can be smoothly spin-coated, and at the same time, the EBL can be carried out. In a specific embodiment of the present application, the material of the polymer solution is selected from polydimethylsiloxane (PDMS). PMDS has stable properties, high temperature resistance, and is easy to cure and form the embedding layers between the chip array.

Further, the step of using the polymer solution to encapsulate and cure the composite structure and the protective layer includes: applying a pressure to the composite structure and the protective layer, filling a polymer solution, and then performing encapsulation and curing. Optionally, the pressure is 10-40 N. The constant pressure is provided to prevent the polymer solution from entering the gaps between the chis and the substrate, so that the polymer solution will not interfere the chips and the substrate during the whole preparation process, which will affect the performance of the chips. If the pressure is too small, the applied pressure on the composite structure will be insufficient, the gaps between the chips and the substrate cannot be prevented from the polymer solution.

In some embodiments, the method of applying pressure is optional but not limited to placing a fixable object (e.g., a weight), or clamping the bottom of the container and the top of the substrate with a clip.

Further, the composite structure is subjected to vacuum treatment. The purpose of the vacuum treatment is to extract the air between the chips and the substrate, and at the same time, to extract the air in the polymer solution, so that the polymer solution has no impurity substances remaining.

In some embodiments, the vacuumizing process is optional but not limited to using a vacuum machine, a nitrogen box having a vacuumizing function, and an ICP plasma etching machine equipped with a vacuum function.

In some embodiments, a container is provided, and a protective layer is provided on the surface of the container, the chip array of the composite structure is adhered to the protective layer, in the step of adding the polymer solution into the container and carrying out the curing process, the amount of added polymer solution is consistent with the height of the upper surface of the first substrate of the composite structure. Controlling the amount of added polymer solution can ensure that the obtained chip embedded composite forms a flat surface.

Further, the temperature and duration of the curing treatment can be determined according to the material of the polymer solution. If there is a very high requirement of flatness, natural curing is preferable to prevent the uneven surface caused by thermal expansion and contraction of the polymer.

In a specific embodiment of the present application, a container is provided, and a protective layer is arranged on the surface of the container, the chip array of the composite structure is attached to the protective layer, the material of the polymer solution is selected from polydimethylsiloxane having amass ratio of 10:1, the prepared PDMS solution is vacuumed, and then slowly poured to the side of the composite structure. A constant pressure is applied to the first substrate during operation until the PDMS solution is slightly above the upper surface of the first substrate. The entire device is placed on a hot plate and heated at 100° C. for 35 min until the upper layer of PDMS is cured.

In step S04, the protective layer is removed to obtain a chip embedded composite.

Further, the step of removing the protective layer includes: cutting and removing the protective layer, and cleaning with an organic solvent.

In some embodiments, the cured composite is cut and separated with a clean knife, the chip embedded composite is taken out, and the chip embedded composite is soaked in acetone for 1-2 minutes until the impurity material falls off.

Further, after the preparation of the finished product is completed, the chip embedded composite needs to be cleaned several times with acetone and isopropanol to meet the cleanliness requirements. If there are other effective cleaning solvents, the other effective cleaning solvents can be used to replace acetone and isopropanol, but it is necessary to ensure that other effective cleaning solvents will not react with the polymer material and damage the surface flatness of the finished product.

In some embodiments, the preparation method of the chip embedded composite includes the following steps:
- a composite structure is provided, and the composite structure includes a first substrate, a conductive layer disposed on a surface of the first substrate, and a chip array disposed on a surface of the conductive layer facing away from the first substrate;
- a container is provided, a flat protective layer is disposed on the surface of the container, the composite structure is placed on the surface of the protective layer, and the protective layer covers the chip array;
- a pressure is applied to the composite structure and vacuum treatment is carried out, a polymer solution is added to the container and followed by encapsulating and curing treatment;

The protective layer is removed to obtain a chip embedded composite.

In a specific embodiment of the present application, PDMS is provided as a polymer material to prepare the chip embedded composite. The preparation method includes the following:

a petri dish is provided, and the surface of the petri dish is cleaned, the dish is soaked in acetone for about 2 minutes and acetone is poured into the waste tank, then isopropanol is used to clean the residual acetone on the surface of the petri dish, and finally the surface of the petri dish is dried with a nitrogen gun to obtain a clean surface of the petri dish;

the PDMS solution is prepared, A solution (about 5 ml) and B solution of the PDMS solution with a mass ratio of 10:1 are prepared, the mixed solution is stirred with a glass rod until it is uniform, the mixed solution is poured into a glass dish, and placed into a vacuum machine. Vacuumize it until there are no bubbles on the liquid surface, and finally the petri dish is placed on a hot plate and heat at 120° C. for 30 minutes to form a flat protective layer;

the surfaces of the two chiplets and the two silicon wafers are cleaned with acetone and isopropanol, and the first silicon wafer is bonded to the substrates of the two chiplets by using the ECA-1003 conductive adhesive and pressed tightly. a hot plate at 120° C. is used for heat curing, the second silicon wafer is placed on the hot plate at 180° C. for 90 seconds, spin-coated with the PMMA e-beam resist by a spin-coating machine, and is heated on the hot plate at 150° C. for 60 seconds to obtain a uniformly spin-coated second silicon wafer with electronic adhesive. Then, the second silicon wafer after spin-coating is placed on the surface of the cured PDMS petri dish, and the cured chiplets-conductive adhesive-silicon wafer is pressed on the spin-coated silicon wafer. Pressure is applied on the upper surface of the silicon wafer and the wafer is placed into a vacuum machine to be vacuumized, so as to achieve the effect that there is no air between the silicon wafer and the chiplets;

Prepare a PDMS solution with a mass ratio of 10:1, and the amount of solution A is about 5 ml. First, the prepared PDMS solution is vacuumized, and then slowly poured to the side of the sandwich structure. During the operation, ensure that the upper silicon wafer is continuously subjected to constant pressure. Pressure is applied until the PDMS solution is slightly above the upper surface of the upper silicon wafer. The entire device is placed on a hot plate and heat at 100° C. for 35 minutes until the upper layer of PDMS is cured;

the sandwich structure is cut off with a clean knife, and the sandwich structure is soaked in acetone until the PMMA e-beam resist is dissolved, and the second silicon wafer falls off the sandwich structure to obtain a chip embedded composite.

Figure 3:
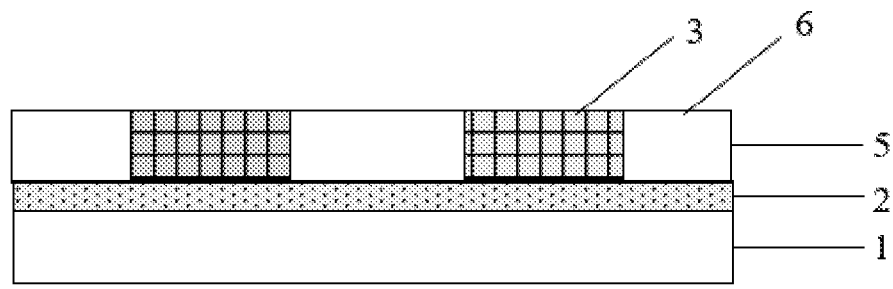
FIG. 3 is a structural view of the chip embedded composite provided in the embodiment of the present application.
Figure 4:
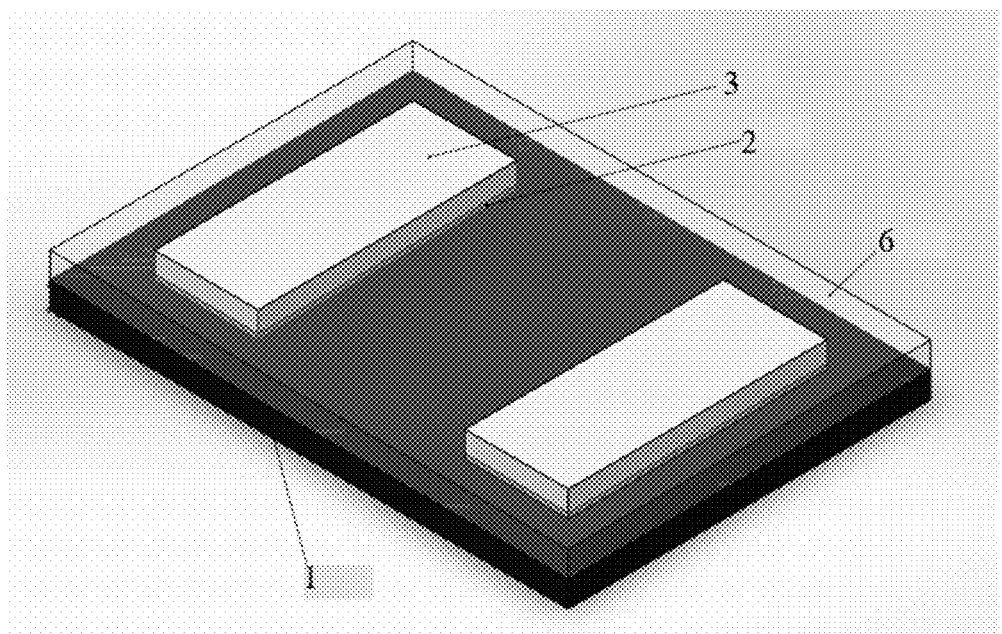
FIG. 4 is a perspective view of the chip embedded composite provided in the embodiment of the present application.
Figure 5:
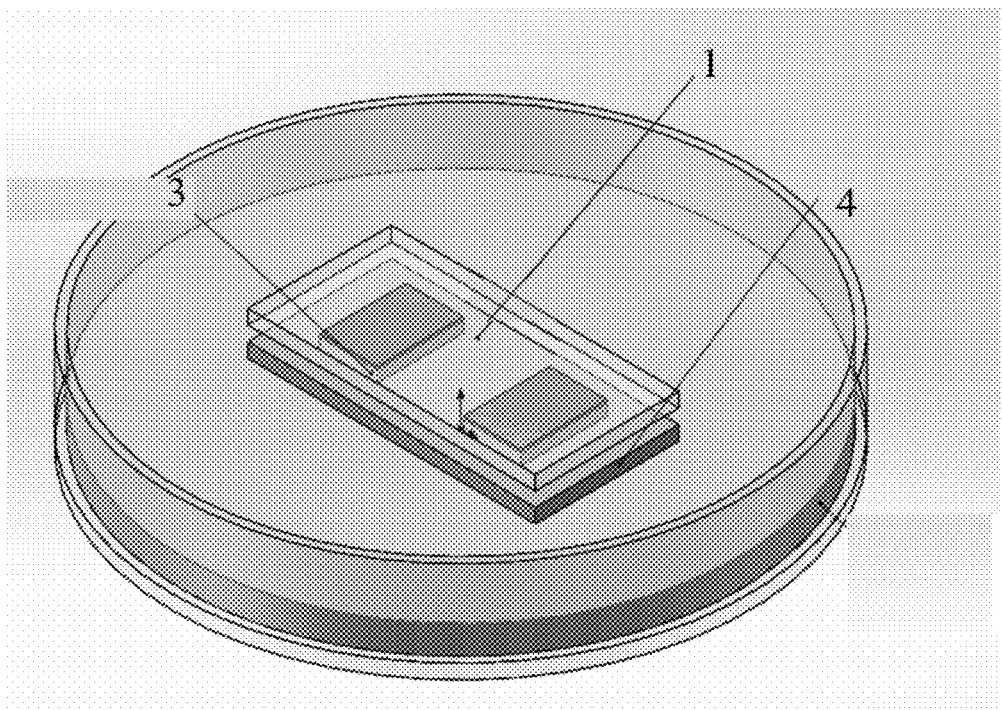
FIG. 5 is a schematic diagram of the composite structure laminated with the protective layer in the embodiment of the present application.
Figure 6:
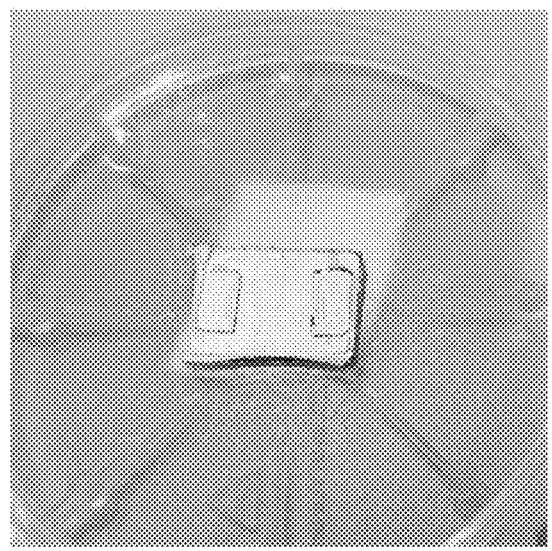
FIG. 6 is a photo of the finished chip embedded composite provided in the embodiment of the present application after spin-coating.

A second aspect of the embodiments of the present application provides a chip embedded composite for electron beam photolithography. As shown in FIG. 3, the chip embedded composite includes a first substrate 1, a conductive layer 2 disposed on the surface of the first substrate 1, and a chip embedded layer 5 disposed on the conductive layer 2 away from the first substrate 1, and the chip embedded layer 5 includes a chip array 3 in contact with the conductive layer and an embedding layer 6 distributed between the chip array. A perspective view of the obtained chip embedded complex is shown in FIG. 5.

In the chip embedded composite for EBL provided in the second aspect of the present application, since the chip array and the embedding layer disposed between the chip array are at the same level, the obtained embedded composite can be directly and evenly spin-coated, and EBL can be carried out, while the chip embedded composite maximizes the use of the lithography area of the chip without causing waste, and the conductive layer is provided to achieve the effect of conducting electricity, maintaining the overall conductivity of the composite, so that under the high-voltage operation of the EBL, the electrons pass through the surface of the chip and will not accumulate inside the chip, which is detrimental to the pattern. The final product has high yield, stable performance, and excellent tolerance.

In some embodiments, the thickness of the embedded layer is 15 microns thinner compared to the chip array, and the height difference between the embedded layer and the chip is controlled to be small, so as to ensure uniform spin-coating process.

In some embodiments, after the spin-coating the chip embedded composite, the whole structure is scanned by SEM. If the chip surface can be observed by SEM, a good conductivity of chips is indicated, which meets the requirement of EBL conductivity.

Further, in order to obtain better spin-coating results, a layer of adhesion promoter may be spin-coated on the surface of the chip embedded layer (i.e., the chips and the polymer material layer) to create a smoother surface. Optionally, the adhesion promoter is selected from hexamethyl-disilazane, since hexamethyl-disilazane can improve the adhesion of the material and interact with the silicon dioxide on the surface of the substrate to produce a strong waterproof layer, which improves the adhesion of the material, effectively preventing the developer from penetrating the e-beam resist. Its thickness is not limited and can be adjusted according to the height difference of the chip embedded layer.

The third aspect of the embodiments provides the application of the chip embedded composite for EBL in defining integrated circuits by EBL.

The chip embedded composite for EBL provided in the third aspect of the present application is applied to the design of integrated circuits by EBL. Due to the flat surface of chip embedded composite, it can be directly and evenly spin-coating, and can be widely used in EBL, which is used to define the pattern when EBL, improving the utilization rate of chips. The following description will be explained in conjunction with detailed embodiments.

Example 1

Chip Embedded Composite for EBL and Preparation Method of a Chip Embedded Composite
Preparation Method of a Chip Embedded Composite The preparation method includes the following steps:

two pieces epitaxial semiconductor chiplets (2 mm×4 mm), two pieces (100)-orientation P or N doped silicon wafers (8 mm×10 mm), a glass dish with a diameter of 60 mm, 10 ml PDMS solution A, 1 ml PDMS solution B (curing agent), ECA-1003 conductive adhesive, and PMMA e-beam resist are provided. Required instruments: hot plate, spin-coater, nitrogen gun, vacuum machine, step meter;

As shown in FIG. 5, a composite structure is provided, wherein the composite structure includes a first substrate, a conductive layer disposed on the surface of the first substrate, and a chip array disposed on a surface of the conductive layer facing away from the first substrate; A protective layer is arranged on the outer surface, and the protective layer covers the chip array:

the surfaces of the two small chips and the two silicon wafers are cleaned with acetone and isopropanol until they are clean, and the first silicon wafer is bonded to the two small chip substrate surfaces symmetrically by using the ECA-1003 conductive adhesive and pressed tightly. A hot plate at 120° C. is used for heat curing, the second silicon wafer is placed on the hot plate at 180° C. for 90 seconds, the wafer surface is spin-coated with PMMA e-beam resist, and then baked on the hot plate at 150° C. for 60 seconds to obtain a uniform surface of the second silicon wafer. The second silicon wafer is placed on the surface of the cured PDMS petri dish, and the cured chiplet-conductive adhesive-silicon wafer is pressed on the spin-coated silicon wafer. A pressure is applied on the upper surface of the silicon wafer and the wafer is put into a vacuum machine to be vacuumized, so as to fully extract air between the silicon wafer and the chiplets;

The composite structure and protective layer are encapsulated and cured using polymer solutions.

a glass petri dish with a diameter of 60 mm is provided, and the surface of the petri dish is cleaned, the dish is soaked in acetone for about 2 minutes, then the residual acetone on the surface of the petri dish is washed with isopropanol, and finally the surface of the petri dish is dried with a nitrogen gun to obtain a clean petri dish surface;

The PDMS solution is prepared by providing A solution (about 5 ml) and B solution of the PDMS solution with a mass ratio of 10:1, stirring the mixed solution with a glass rod until it is uniform, pouring the mixed solution into a glass dish, and placing it into a vacuum machine. The solution is vacuumize until there are no bubbles on the liquid surface, and is finally placed on a hot plate and heat it at 100° C. for 30 minutes to form a flat protective layer;

The PDMS solution with a mass ratio of 10:1 is prepared, and the amount of solution A is about 5 ml. First, the prepared PDMS solution is vacuumized, and then slowly poured to the side of the sandwich structure. During the operation, ensure that the upper silicon wafer is continuously subjected to constant pressure until the PDMS solution is slightly above the upper surface of the upper silicon wafer. the whole device is placed on a hot plate and heat at 100° C. for 30 minutes until the upper layer of PDMS is cured;

the protective layer is removed to obtain the chip embedded composite:

The sandwich structure is cut off with a clean knife, and the sandwich structure is soaked in acetone until the PMMA e-beam resist is dissolved, and the second silicon wafer falls off the sandwich structure to obtain a chip embedded composite.

Chip Embedded Composite

The chip embedded composite includes a first substrate, a conductive layer disposed on the surface of the first substrate, a chip embedded layer disposed on the conductive layer away from the first substrate, and the chip embedded layer includes a chip array and an embedding layer disposed between the chip array.

Example 2

Chip embedded composite for EBL and preparation method of a chip embedded composite.

Preparation method of a chip embedded composite.
The preparation method includes the following steps:
two pieces of epitaxial semiconductor chiplets (2 mm×4 mm), two pieces of (100)-orientation P or N doped silicon wafers (8 mm×10 mm), a glass dish with a diameter of 60 mm, 10 ml PDMS solution A, 1 ml PDMS liquid B (curing agent), ECA-1003 conductive adhesive, PMMA e-beam resist are provided. Required instruments: hot plate, spin-coater, nitrogen gun, vacuum machine, step meter;

a composite structure is provided, including a first substrate, a conductive layer disposed on the surface of the first substrate, and a chip array disposed on a surface of the conductive layer away from the first substrate; a protective layer is arranged on the outer surface of the chip array for protection:

The surfaces of the two small chips and the two silicon wafers are cleaned with acetone and isopropanol until they are clean, and the first silicon wafer is bonded to the two small chip substrate surfaces symmetrically by using the ECA-1003 conductive adhesive and pressed tightly. A hot plate at 120° C. is used for heat curing, and the cured chiplets-conductive adhesive-silicon wafer is flatly pressed on the PDMS, and a vacuum condition is achieved after applying a downward pressure;

The composite structures and protective layer are encapsulated and cured using the polymer solution:

a glass petri dish with a diameter of 60 mm is provided, and the surface of the petri dish is cleaned by soaking it in acetone for about 2 minutes and pour acetone into the waste tank, then washing the residual acetone on the surface of the petri dish with isopropanol and finally drying the surface of the petri dish with nitrogen gun to obtain a clean petri dish surface;

the PDMS solution is prepared by providing A solution (about 5 ml) and B solution of the PDMS solution with a mass ratio of 10:1.2, stirring the mixed solution with a glass rod until it is uniform, pouring the mixed solution into a glass dish, and placing it into a vacuum machine, vacuumizing it until there are no bubbles on the liquid surface, and finally placing the petri dish on a hot plate and heat it at 100° C. for 30 minutes to form a flat protective layer;

the PDMS solution with a mass ratio of 10:1.2 is prepared, and the amount of solution A is about 5 ml. First, the prepared PDMS solution is vacuumized, and then slowly poured to the side of the sandwich structure. During the operation, it is necessary to ensure that the upper silicon wafer is continuously subjected to constant pressure until the PDMS solution is slightly above the upper surface of the upper silicon wafer. Place the whole device on a hot plate and heat at 120° C. for 35 minutes until the upper layer of PDMS is cured;

the protective layer is removed to obtain the chip embedded composite:

the chip embedded composite is taken out with a clean knife, and is soaked and cleaned in acetone to obtain a clean composite.

Chip Embedded Composite

The chip embedded composite includes a first substrate, a conductive layer disposed on the surface of the first substrate, a chip embedded layer disposed on the conductive layer away from the first substrate, and the chip embedded layer includes a chip array and an embedding layer disposed between the chip array.

Example 3

Chip embedded composite for EBL and preparation method of a chip embedded composite Preparation Method of a Chip Embedded Composite The preparation method includes the following steps:
- two pieces of epitaxial semiconductor chiplets (2 mm×4 mm), two pieces (100)-orientation P or N doped silicon wafers (8 mm×10 mm), a glass dish with a diameter of 60 mm, benzocyclobutene mixed solution (BCB solution), ECA-1003 conductive adhesive, PMMA e-beam resist are provided. Required instruments: hot plate, spin-coater, nitrogen gun, vacuum machine, step meter;
- a composite structure is provided, the composite structure includes a first substrate, a conductive layer disposed on the surface of the first substrate, and a chip array disposed on a surface of the conductive layer away from the first substrate; a protective layer is arranged on the outer surface of the chip array:
- the surfaces of the two chiplets and the two silicon wafers are cleaned with acetone and isopropanol until they are clean, and the first silicon wafer is bonded to the substrates of the two chiplets symmetrically by using the ECA-1003 conductive adhesive and pressed tightly. a hot plate 120° C. is used for heat curing, the second silicon wafer is placed on the hot plate at 180° C. for 90 seconds, and is spin-coated with the PMMA e-beam resist with a spin-coater, and then is baked on the hot plate at 150° C. for 60 seconds to obtain a uniformly spin-coated e-beam resist. The spin-coated second silicon wafer is placed on the surface of the petri dish after curing the BCB, and the cured chiplets-conductive adhesive-silicon wafer is pressed as a whole on the spin-coated silicon wafer. pressure is applied on the upper surface of the silicon wafer and the wafer is placed into a vacuum machine to be vacuumized, so as to achieve the effect that there is no air between the silicon wafer and the chiplets;
- the composite structure and protective layer are encapsulated and cured using the polymer solution:
- a glass petri dish with a diameter of 60 mm is provided, and the surface of the petri dish is cleaned by soaking it in acetone for about 2 minutes and pouring acetone into the waste tank, then washing the residual acetone on the surface of the petri dish with isopropanol, and finally drying the surface of the petri dish with a nitrogen gun to obtain clean petri dish surface;
- the BCB solution is prepared by providing A solution (about 5 ml) and B solution of the BCB solution with a mass ratio of 10:1, stirring the mixed solution with a glass rod until it is uniform, pouring the mixed solution into a glass dish, and placing it into a vacuum machine, vacuumizing it until there are no bubbles on the liquid surface, and finally placing the petri dish on a hot plate and heat it at 100° C. for 30 minutes to form a flat protective layer;
- the BCB solution with a mass ratio of 10:1 is prepared, And the amount of solution A is about 5 ml. First, the prepared BCB solution is vacuumized, and then slowly poured to the side of the sandwich structure. During the operation, it is necessary to ensure that the upper silicon wafer is continuously subjected to constant pressure. Pressure is applied until the BCB solution is slightly above the upper surface of the upper silicon wafer. the whole device is placed on a hot plate and heat at 100° C. for 30 minutes until the upper layer of BCB is cured;

The protective layer is removed to obtain the chip embedded composite:

The sandwich structure is cut out with a clean knife, and the sandwich structure is soaked in acetone until the PMMA e-beam resist is dissolved, and the second silicon wafer fell off the sandwich structure to obtain a chip embedded composite.

Chip Embedded Composite

The chip embedded composite includes a first substrate, a conductive layer disposed on the surface of the first substrate, a chip embedded layer disposed on the conductive layer away from the first substrate, and the chip embedded layer includes a chip array and an embedding layer disposed between the chip array.

Properties Testing

The chip embedded composites obtained in Examples 1-3 are tested for the height differences between the polymer and the surface of the chips before spin-coating are respectively measured, the height differences between the polymer and the surface of the chips after spin-coating, and the roughness of the chips surface after spin-coating. The data are as shown in Table 1. As shown in Table 1 below, in Example 1, the surface of the polymer and the chips before spin-coating is 9837.06 nm, the surface of the polymer and the chips after spin-coating is 3398.62 nm, and the roughness of the chips after spin-coating is 3 nm. In Example 2, the surface of the polymer and the chips before spin-coating is 9830.06 nm, the surface of the polymer and the chips after spin-coating is 3390.62 nm, and the roughness of the chips after spin-coating is 4 nm. In Example 3, the surface of the polymer and the chips before spin-coating is 9835.06 nm, the surface of the polymer and the chips after spin-coating is 3392.62 nm, and the roughness of the chips after spin-coating is 5 nm.

In summary, the present application provides a method for preparing a chip embedded composite for EBL. The preparation method utilizes a composite structure including chips as a raw material. The composite structure is placed in a container such that the chips in the composite material are in contact with the soft bottom surface of the container. The polymer solution is added for curing, and an embedding layer is formed in the intervals of the chip array to obtain the chip embedded composite. The chip embedded composite includes the embedding layer located between and in the same horizontal plane of the chip array, so that the surface of the chip can be directly spin-coated evenly, and EBL can be carried out, which makes full use of the lithography area of the chip, so that chiplets with small size will not be wasted in lithography. The method improves the utilization rate of the chip, and at the same time, the composite structure includes a conductive layer to realize ground conduction, which is beneficial to the EBL process and future application; the preparation method benefits from low material cost, simple production process, convenient operation, and short operation time. The obtained chip embedded composite has high yield, stable performance, and high operation fault tolerance, is therefore favorable for wide use.

TABLE 1

| | Surface of the polymer and the chips (before spin-coating) | Surface of the polymer and the chips (after spin-coating) | Roughness of the chips |
|---|---|---|---|
| Example 1 | 9837.06 nm | 3398.62 nm | 3 nm |
| Example 2 | 9830.06 nm | 3390.62 nm | 4 nm |
| Example 3 | 9835.06 nm | 3392.62 nm | 5 nm |

The above is only preferred embodiments of the application, and are not intended to limit the application. Any modifications, equivalent replacements and improvements made within the spirit and principles of the application fall within the scope of protection of the application.

What is claimed is:

1. A method for preparing a chip embedded composite for electron beam lithography, the chip embedded composite for electron beam lithography comprising:
   a first substrate;
   a conductive layer, disposed on a surface of the first substrate; and
   a chip-embedded layer, disposed on a surface of the conductive layer away from the first substrate, and comprising;
      a chip array in contact with the conductive layer, and an embedding layer distributed between the chip array;
   a thickness of the embedding layer being less than or equal to 15 microns thinner than the chip array;
   the method comprising:
      providing a composite structure, wherein the composite structure comprises the first substrate, the conductive layer disposed on the surface of the first substrate, and the chip array disposed on the surface of the conductive layer facing away from the first substrate;
      arranging a protective layer on an outer surface of the chip array, the protective layer covering the chip array;
      encapsulating and curing the composite structure and the protective layer with a polymer solution; and
      removing the protective layer to obtain the chip embedded composite.

2. The method of claim 1, wherein the protective layer is selected from a soft film layer or a hard-substrate composite with a flat surface;
   wherein, the hard-substrate composite comprises a second substrate and a connection layer, and the connection layer and the second substrate are stacked in sequence along an extending direction from the conductive layer to the chip array, and the connection layer covers the chip array.

3. The method of claim 2, wherein the step of encapsulating and curing the composite structure and the protective layer with a polymer solution comprises: applying a pressure to the composite structure and the protective layer, filling with a polymer solution, and then performing encapsulation and curing treatment.

4. The method of claim 3, wherein the pressure is 10-40 N.

5. The method of claim 2, wherein the step of removing the protective layer comprises: cutting and removing the protective layer, and using organic solvent for cleaning.

6. The method of claim 2, wherein a size of chips is (2-3) mm×(4-5) mm.

7. The method of claim 1, wherein the polymer solution is at least one selected from a group consisting of polydimethylsiloxane, benzocyclobutene, epoxy resin, dimethylsiloxane, cyclomethicone, aminosiloxane, polymethylphenylsiloxane, and polyether polysiloxane copolymer.

8. The method of claim 7, wherein the step of encapsulating and curing the composite structure and the protective layer with a polymer solution comprises: applying a pressure to the composite structure and the protective layer, filling with a polymer solution, and then performing encapsulation and curing treatment.

9. The method of claim 8, wherein the pressure is 10-40 N.

10. The method of claim 7, wherein the step of removing the protective layer comprises: cutting and removing the protective layer, and using organic solvent for cleaning.

11. The method of claim 7, wherein a size of chips is (2-3) mm×(4-5) mm.

12. The method of claim 1, wherein the step of encapsulating and curing the composite structure and the protective layer with a polymer solution comprises: applying a pressure to the composite structure and the protective layer, filling with a polymer solution, and then performing encapsulation and curing treatment.

13. The method of claim 12, wherein the pressure is 10-40 N.

14. The method of claim 1, wherein the step of removing the protective layer comprises: cutting and removing the protective layer, and using organic solvent for cleaning.

15. The method of claim 1, wherein a size of chips is (2-3) mm×(4-5) mm.

* * * * *